(12) United States Patent
Kitai et al.

(10) Patent No.: US 9,824,892 B2
(45) Date of Patent: Nov. 21, 2017

(54) SEMICONDUCTOR FORMATION BY LATERAL DIFFUSION LIQUID PHASE EPITAXY

(75) Inventors: Adrian Kitai, Mississauga (CA); Haoling Yu, Toronto (CA); Bo Li, Hamilton (CA)

(73) Assignee: McMaster University, Hamilton, Ontario (CA)

( * ) Notice: Subject to any disclaimer, the term of this patent is extended or adjusted under 35 U.S.C. 154(b) by 1229 days.

(21) Appl. No.: 13/812,089

(22) PCT Filed: May 17, 2012

(86) PCT No.: PCT/CA2012/050327
§ 371 (c)(1),
(2), (4) Date: Jan. 24, 2013

(87) PCT Pub. No.: WO2012/155273
PCT Pub. Date: Nov. 22, 2012

(65) Prior Publication Data
US 2013/0119518 A1     May 16, 2013

Related U.S. Application Data

(60) Provisional application No. 61/487,005, filed on May 17, 2011.

(51) Int. Cl.
*H01L 21/02* (2006.01)
*H01L 29/06* (2006.01)
(Continued)

(52) U.S. Cl.
CPC .......... *H01L 21/02634* (2013.01); *C30B 9/10* (2013.01); *C30B 19/12* (2013.01);
(Continued)

(58) Field of Classification Search
CPC combination set(s) only.
See application file for complete search history.

(56) References Cited

U.S. PATENT DOCUMENTS 3,692,594 A * 9/1972 Cannuli ............ H01L 21/02395
117/61
4,032,370 A * 6/1977 Matare .................. C30B 19/062
117/60
(Continued)

FOREIGN PATENT DOCUMENTS

CN     101113634 A     1/2008
EP     0472452 A      2/1992
(Continued)

OTHER PUBLICATIONS

International Search Report and Written Opinion for PCT/CA2012/050327 dated Sep. 26, 2012.
(Continued)

*Primary Examiner* — Duy Deo
*Assistant Examiner* — Erin Bergner
(74) *Attorney, Agent, or Firm* — Pepper Hamilton LLP

(57) ABSTRACT

A method for growing semiconductor wafers by lateral diffusion liquid phase epitaxy is described. Also provided are a refractory device for practicing the disclosed method and semiconductor wafers prepared by the disclosed method and device. The disclosed method and device allow for significant cost and material waste savings over current semiconductor production technologies.

21 Claims, 13 Drawing Sheets

(51) Int. Cl.
    *C30B 9/10*     (2006.01)
    *C30B 19/12*    (2006.01)
    *C30B 29/06*    (2006.01)

(52) U.S. Cl.
    CPC .......... *C30B 29/06* (2013.01); *H01L 21/0237* (2013.01); *H01L 21/02381* (2013.01); *H01L 21/02433* (2013.01); *H01L 21/02532* (2013.01); *H01L 21/02625* (2013.01); *H01L 21/02628* (2013.01); *H01L 21/02645* (2013.01); *H01L 21/02658* (2013.01); *H01L 29/0657* (2013.01)

(56) References Cited

U.S. PATENT DOCUMENTS

| | | | |
|---|---|---|---|
| 4,214,550 A * | 7/1980 | Hawrylo | C30B 19/061 118/412 |
| 4,401,487 A * | 8/1983 | Lockwood | C30B 19/04 117/67 |
| 4,876,210 A * | 10/1989 | Barnett | H01L 21/02381 117/58 |
| 4,999,314 A * | 3/1991 | Pribat | H01L 21/76248 117/106 |
| 5,273,929 A | 12/1993 | Hirtz et al. | |
| 2010/0105194 A1* | 4/2010 | Pan | C30B 11/002 438/481 |

FOREIGN PATENT DOCUMENTS

| | | |
|---|---|---|
| JP | 60-052016 | 3/1985 |
| JP | H01161822 A | 9/1989 |
| JP | H04299525 A | 10/1992 |

OTHER PUBLICATIONS

Capper et al., Liquid phase epitaxy of electronic optical & optoelectronic materials (Series in materials for electronic & optoelectronic applications), http://www.lavoisier.fr/livre/notice.asp?ouvrage=1352240 (Printed from Internet Nov. 26, 2012).
Kim et al., String ribbon silicon solar cells with 17.8% efficiency, *Photovoltaic Energy Conversion, 2003. Proceedings of 3rd World Conference* (May 18, 2003), 2:1293-1296 (Abstract).
Miyao et al., Giant Ge-on-Insulator Formation by Si—Ge Mixing-Triggered Liquid-Phase Epitaxy, *Applied Physics Express* (2009), 2:045503.1-045503.3.
Nishida et al., Si-film growth using liquid phase epitaxy method and its application to thin-film crystalline Si solar cell, *Solar Energy Materials & Solar Cells* (2001), 65:525-532.
Ohta et al., Growth-direction-dependent characteristics of Ge-on-insulator by Si—Ge mixing triggered melting growth, *Solid-State Electronics* (Jun. 2011), 60(1):18-21 (Abstract).
Scott et al., Solution growth of Indium-Doped silicon, *Journal of Electronic Materials* (Sep. 1979), 8(5):581-602 (Abstract).
Shi et al., The effects of solvent and dopant impurities on the performance of LPE silicon solar cells, *Solar Energy Materials and Solar Cells* (Jun. 1996), 41-42:53-60 (Abstract).
Stocks et al., Fabrication of solar cells using the epilift technique, *Photovoltaic Energy Conversion, 2003. Proceedings of 3rd World Conference* (May 18, 2003), 2:1268-1271 (Abstract).
Sukegawa et al., Gravity effect on dissolution and growth of silicon in the In—Si System, *Journal of Crystal Growth* (Oct. 1988), 92(1-2):46-52 (Abstract).
Tanaka et al., Giant growth of single crystalline Ge on insulator by seeding lateral liquid-phase epitaxy, *Thin Solid Film* (Jan. 2010), 518(6):Suppl 1:S170-S173 (Abstract).
Weber et al., The Epilift technique for Si solar cells, *Applied Physics A* (Jul. 1, 1999), 69:195-199.
"53rd Electronic Materials Conference and Exhibition," EMC, pp. 1-136 (Jun. 22-24, 2011).
Gulkowski, S., et al., "Modelling of the Interface Evolution During Si Layer growth on a Partially Masked Substrate," Task Quaterly, vol. 15, No. 1, pp. 91-98 (Jan. 31, 2011).
Kita, K., et al., "Study on the lateral growth of silicon films from metal solutions with temperature gradient," Journal of Crystal Growth, vol. 234, Issue 1, pp. 153-158 (Jan. 2002).
Li, B., "Lateral Diffusion LPE Growth of Single Crystalline Silicone for Photovoltaic Applications," Thesis, McMaster University, pp. 1-174 (Apr. 2012).
Li, B., and Kitai, A.H., "Mono-crystalline silicon strips grown by liquid phase epitaxy for photovoltaic applications," Proc. SPIE 7750, Photonics North 2010, (Sep. 22, 2010).
Wagner, B.F., et al., "15.9% efficiency for Si thin film concentrator solar cell grown by LPE," Conference Record of the Twenty Third IEEE Photovoltaic Specialists Conference, pp. 356-359 (May 10-14, 1993).
Weber, K.J., et al., "Silicon As a Photovoltaic Material," Materials Forum, vol. 27, pp. 9-14 (2004).
Yu, H.L. et al., "Lateral diffusion epitaxy (LDE) of single crystal silicon with downward facing substrate Luke," Photonics North 2012, Proceedings of the SPIE, vol. 8412, 7 pages (Oct. 23, 2012).
Chang et al., Effect of growth temperature on epitaxial lateral overgrowth of GaAs on Si substrate, *Journal of Crystal Growth* (1997), 174:630-634.
Ogura, A., and Fujimoto, Y., "Novel technique for Si epitaxial lateral overgrowth: Tunnel epitaxy", Applied Physics Letters, vol. 55, No. 21, pp. 2205-2207 (Nov. 20, 1989).

* cited by examiner

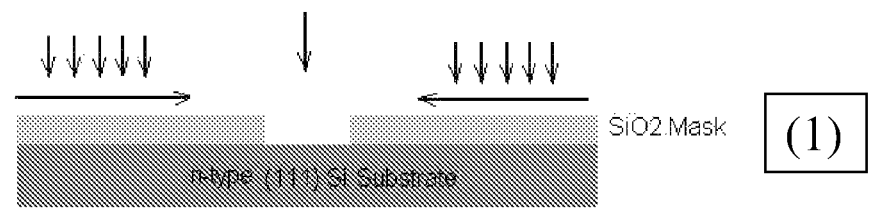
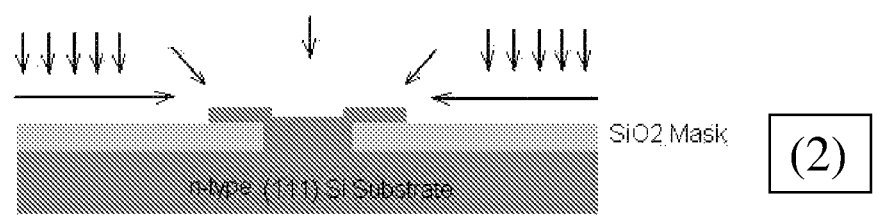
Figure 11
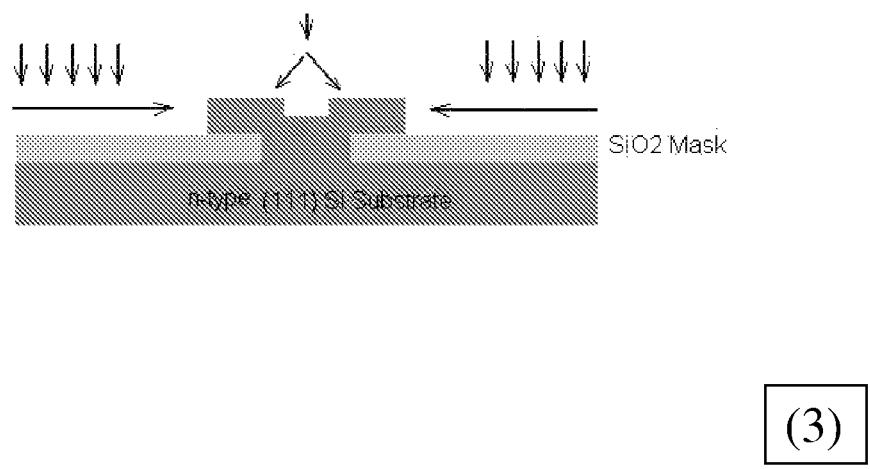

SEMICONDUCTOR FORMATION BY LATERAL DIFFUSION LIQUID PHASE EPITAXY

CROSS-REFERENCE TO RELATED APPLICATIONS

This application is a U.S. national stage filing under 35 U.S.C. §371 of International Application No. PCT/CA2012/050327, filed on May 17, 2012 and entitled "Semiconductor Formation by Lateral Diffusion Liquid Phase Epitaxy," which claims priority to U.S. Provisional Application No. 61/487,005 filed on May 17, 2011, the contents of which are incorporated herein by reference.

BACKGROUND

Currently, the technology for production of single crystalline semiconductor wafers or substrates involves cutting thin wafers from a single crystalline semiconductor ingot. After cutting, the wafers need to be polished to remove the damage caused by the cutting process. The cutting and polishing processes are expensive and cause a large amount waste of material.

The liquid phase epitaxy (LPE) technique was developed to address these issues and has been used to grow premium quality semiconductor layers from a melt on a substrate at temperatures well below the melting point of the deposited semiconductor. Compared to other epitaxy techniques LPE has a higher growth rate but lower capital cost for both equipment and operation.

Many metals may be used for LPE silicon growth, such as tin, copper, aluminum and indium. A solution of silicon in molten metal is formed. Because indium has a low melting point (156.6° C.), relatively more silicon may be dissolved in liquid indium to form an indium/silicon alloy. Because solubility of silicon in indium decreases with decreasing temperature, when the temperature of silicon-saturated indium melt decreases, the decrease in silicon solubility in indium results in nucleation of silicon and epitaxial growth on the substrate. The maximum indium solubility in silicon is $2.5 \times 10^{18}$ atoms/cm$^{-3}$ at a temperature of 1300° C.

One of the limitations of liquid phase epitaxy is that the epitaxially grown structures are necessarily supported on single crystal substrates. The new wafers, therefore, have to be cut away from the supporting substrate resulting loss of material from cutting and polishing, thereby increasing the production costs. Accordingly, there remains a need for a technique for growing self-supported single crystal semiconductor sheets.

SUMMARY

Presently disclosed is a methodology for growing semiconductor materials by lateral diffusion liquid phase epitaxy aimed at achieving self-supported single crystal semiconductor structures.

In an embodiment, a method for growing semiconductor wafers is described. The method may include providing a monocrystalline semiconductor substrate having at least a portion covered by a mask layer with at least one opening for creating a seed line; placing a plate substantially overlapping the seed line such that the plate and the substrate are separated by a distance; surrounding the plate and the substrate with a growth liquid; placing the plate and the substrate in a heated furnace; and decreasing the temperature of the furnace. The plate may have a surface condition that prevents semiconductor growth. The growth liquid may include a saturated solution of a semiconductor in at least one molten metal. Decreasing the temperature of the furnace may promote precipitation of the semiconductor and induce epitaxial growth of the semiconductor on the substrate along the seed line. The plate serves to limit the epitaxial growth in a vertical direction.

In an embodiment, a refractory device suitable for growing semiconductor wafers is described. The device may include a slideboat, a first slider and a second slider. The slideboat may be configured to hold a saturated solution of a semiconductor in at least one molten metal. The first slider may be configured to hold at least one plate. The second slider may be configured to hold at least one substrate and at least one wafer. The first slider and the second slider are placed such that the at least one substrate and the at least one plate are separated by a distance and the at least one plate substantially overlaps the at least one substrate. The at least one plate serves to limit an epitaxial growth of the at least one wafer in a vertical direction and promotes an epitaxial growth in a lateral direction.

In an embodiment, a semiconductor wafer may be prepared by a method including providing a monocrystalline semiconductor substrate having at least a portion covered by a mask layer with at least one opening for creating a seed line; placing a plate substantially overlapping the seed line such that the plate and the substrate are separated by a distance; surrounding the plate and the substrate with a growth liquid; placing the plate and the substrate in a heated furnace; and decreasing the temperature of the furnace. The plate may have a surface condition that prevents semiconductor growth. The growth liquid may include a saturated solution of a semiconductor in at least one molten metal. Decreasing the temperature of the furnace may promote precipitation of the semiconductor and induce epitaxial growth of the semiconductor on the substrate along the seed line. The plate serves to limit the epitaxial growth in a vertical direction.

BRIEF DESCRIPTION OF THE DRAWINGS

FIG. 11 shows the assumed growth process in 2-D cross-section view.

DETAILED DESCRIPTION

Figure 1:
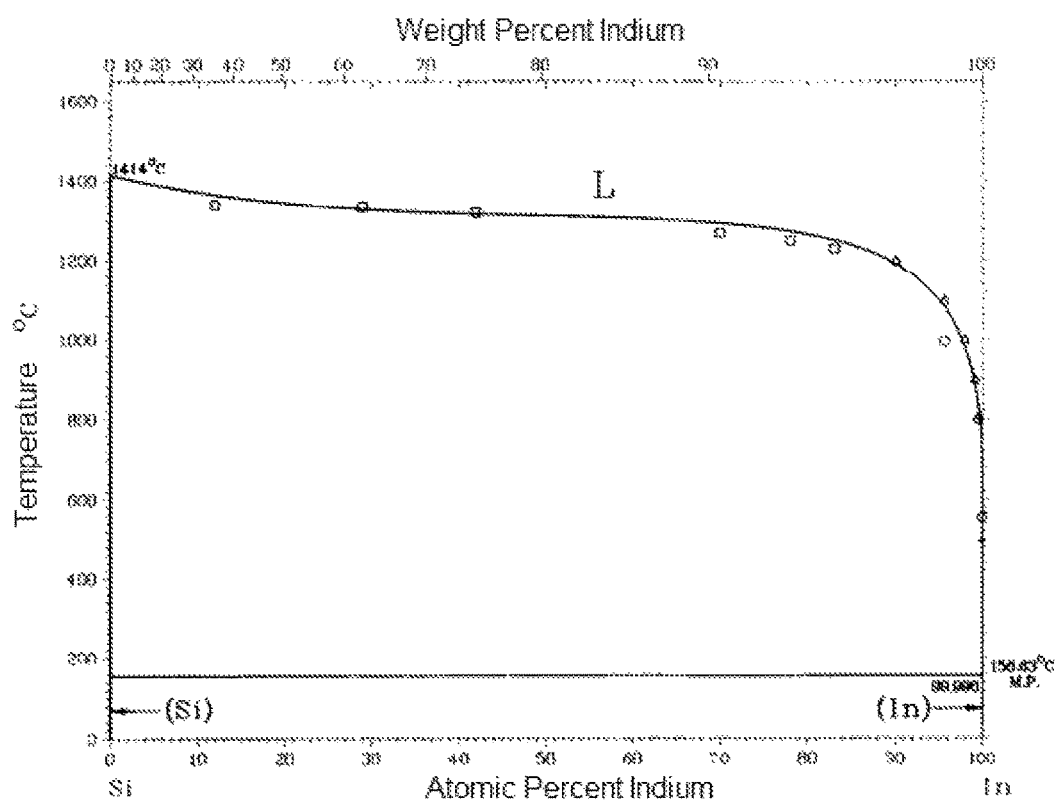
FIG. 1 shows a binary phase diagram of Indium/Silicon system.

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

The terms "wafer", "sheet", "platelet", and their plurals refer to thin structures of the material being referred to and are used interchangeably herein unless the context clearly dictates otherwise.

Presently disclosed is a methodology for growing semiconductor materials by lateral diffusion liquid phase epitaxy aimed at achieving self-supported single crystal semiconductor structures. The method disclosed herein favors growth of the structures along a side-wall by restricting vertical nucleation on a substrate. This results in enhancement of surface smoothness, thereby reducing or eliminating the need for (and wastage caused by) polishing the surface of thus formed sheets or wafers. The geometry of the apparatus used in the method limits the thickness of the sheets thus grown, thereby resulting in high aspect ratio (width/thickness) sheets.

In some aspects, a method for growing semiconductor wafers is described. The method may include providing a monocrystalline semiconductor substrate having at least a portion covered by a mask layer with at least one opening for creating a seed line; placing a plate substantially overlapping the seed line such that the plate and the substrate are separated by a distance; surrounding the plate and the substrate with a growth liquid; placing the plate and the substrate in a heated furnace; and decreasing the temperature of the furnace. The plate may have a surface condition that prevents semiconductor growth. The growth liquid may include a saturated solution of a semiconductor in at least one molten metal. Decreasing the temperature of the furnace may promote precipitation of the semiconductor and induce epitaxial growth of the semiconductor on the substrate along the seed line. The plate serves to limit the epitaxial growth in a vertical direction.

In some embodiments, the substrate may be made of a semiconductor material such as, for example, Si, GaAs, Ge, SiC, or combinations thereof.

In some embodiments, the method may further include cleaning the substrate prior to covering by the mask layer. In some embodiments the cleaning may include sonicating the substrate in presence of organic solvent such as, for example, acetone, methanol, ethanol, propanol, or a combination thereof to rid the substrate surface of any organic residue. In some embodiments, the substrate may be further cleaned in a boiling acid solution such as, for example $H_2SO_4$ in $H_2O_2$, HCl in $H_2O_2$, and the like, followed by rinsing in water. In some embodiments, the water may be deionized water. In some embodiments, the substrate may have a thin layer of native oxide present. This thin layer of oxide may be, in some embodiments, removed by exposing the substrate to a suitable acid etchant solution such as, for example, buffered HF, KOH, $HCl+H_3PO_4$, $H_3PO_4+H_2O_2+H_2O$, $H_2SO_4+H_2O_2+H_2O$, $C_6H_8O_7+H_2O_2$, $HCl+HNO_3+H_2O$, $HNO_3+H_2SO_4$:$H_2O$, $HCL+H_2O_2+H_2O$, and/or the like.

In some embodiments, the method may further include patterning a seed line on the mask layer using photolithography. In some embodiments, a portion of the mask layer such as, for example, $SiO_2$, $Si_3N_4$, and/or the like may be etched in an appropriate etchant solution such as, for example, buffered HF to obtain the seed line on the substrate. In some embodiments, the seed line may have a width of about 10 μm to about 1000 μm. Example seed line widths include about 10 μm, about 50 μm, about 100 μm, about 200 μm, about 300 μm, about 400 μm, about 500 μm, about 600 μm, about 700 μm, about 800 μm, about 900 μm, about 1000 μm, and ranges between any two of these values.

In some embodiments, the growth liquid may be, for example, a saturated solution of the semiconductor in a molten metal such as, for example, In, Sn, Al, Au, Pb, Cu, Ga, or combinations thereof. The particular choice of the molten metal may depend on factors such as, for example, the specific substrate material, melting point of the metal, melting point of the semiconductor to be deposited, the solubility of the semiconductor in the molten metal, temperature dependence of solubility of the semiconductor in the molten metal, and the like. Depending on the choice of the semiconductor and the molten metal, it may be, in some embodiments, desirable to pre-wet the substrate and the plate with the growth liquid prior to surrounding the substrate and the plate with the growth liquid.

In some embodiments, the growth liquid and the substrate may be placed in a slideboat. In some embodiments, the plate is placed on a slide bar that may be configured to fit on to the slideboat. For continuing the epitaxial growth of the semiconductor on the substrate it may be required, in some embodiments, to replenish the semiconductor dissolved in the growth liquid. In some embodiments, a source wafer of the semiconductor material may be, additionally, placed with the growth liquid for the purpose of replenishing the semiconductor in the growth liquid. The selection of alternative and suitable metals to serve as the growth liquid in which a desired semiconductor is saturated for deposition is well known to those skilled in the art. Similarly, suitable furnace temperatures, heating/cooling times and rates, and other furnace conditions can be optimized by skilled artisans.

In some embodiments, the slideboat and the slide bar may be made of refractory materials such as, for example, graphite, alumina, silica, tungsten, zirconia, zirconium (IV) silicate, combinations thereof, and/or the like.

In some embodiments, the plate and the substrate may be separated by a distance. In some embodiments, the distance between the plate and the substrate may be about 0.25 mm to about 0.5 mm.

In some embodiments, the furnace may be evacuated prior to placing the substrate and the plate in the furnace. In some embodiments, the furnace may be further filled with a gas such as, for example, hydrogen to prevent oxidation of the growth liquid, the substrate, or any other components inside the furnace.

In some embodiments, the epitaxial growth may be terminated by moving the substrate away from the growth liquid.

Typically, the structure growing along the seed line is referred to as a platelet while the growth is in progress. The plate serves to limit the epitaxial growth in a vertical direction. This results in a lateral epitaxial growth such that the width of the resultant platelet increases as more semiconductor material gets deposited. As such, a wafer grown by the present technique may have an aspect ratio (width to thickness) of greater than one, dependent on when the growth is terminated. In some embodiments, the aspect ratio of the resultant platelet may be about 0.5 to about 2.75. Specific examples of aspect ratios include about 0.5, about 0.75, about 1, about 1.25, about 1.5, about 1.75, about 2, about 2.25, about 2.5, about 2.75, and ranges between any two of these values.

In some embodiments, the substrate may be a doped or undoped silicon wafer. Because the crystal structure of silicon is distinct from silicon dioxide, no growth of silicon occurs on silicon dioxide surface, making silicon dioxide a suitable material for mask layer and for the plate when the substrate is silicon. In some embodiments, the mask layer for a silicon wafer may be made of silicon dioxide. In some embodiments, the silicon dioxide may be disposed on the silicon wafer by dry oxidation of the silicon wafer. In some embodiments, the plate may be made of silicon dioxide.

Indium has a relatively low melting point of 156.2° C. Silicon is soluble in molten indium and does not react with indium at higher temperatures. Solubility of silicon in indium increases with increasing temperature, making indium a suitable material for the growth liquid (see FIG. 1 for the phase diagram). In some embodiments, the growth liquid may be a saturated solution of silicon in indium. In some embodiments, a furnace may be heated to a temperature of about 950° C. prior to placing the substrate and the plate in the furnace. In some embodiments, the growth liquid, the substrate and the plate may be baked in furnace for about 8 to about 24 hours prior to surrounding the substrate and the plate with the growth liquid in presence of hydrogen in order to remove any oxidized materials. In some embodiments, the temperature of the furnace may be decreased to about 850° C. after surrounding the substrate and the plate with the growth liquid. In some embodiments, the temperature is decreased at a rate of about 0.25° C./minute.

The teachings of this disclosure are not limited to the specific materials and values of the parameters described herein. Suitable and alternative materials for the substrate, the mask layer, the plate, the slideboat, the slide bar and so forth will be readily apparent to one skilled in the art. A skilled artisan will be, similarly, able to optimize the various parameters necessary for practicing the disclosed methods such as, but not limited to, the distance between the plate and the substrate, the temperatures for various steps in the methods, the heating/cooling rates, the duration of pre-wetting, the duration for heat-curing the apparatus, the dimensions of the seed line(s), and so forth.

Figure 2:
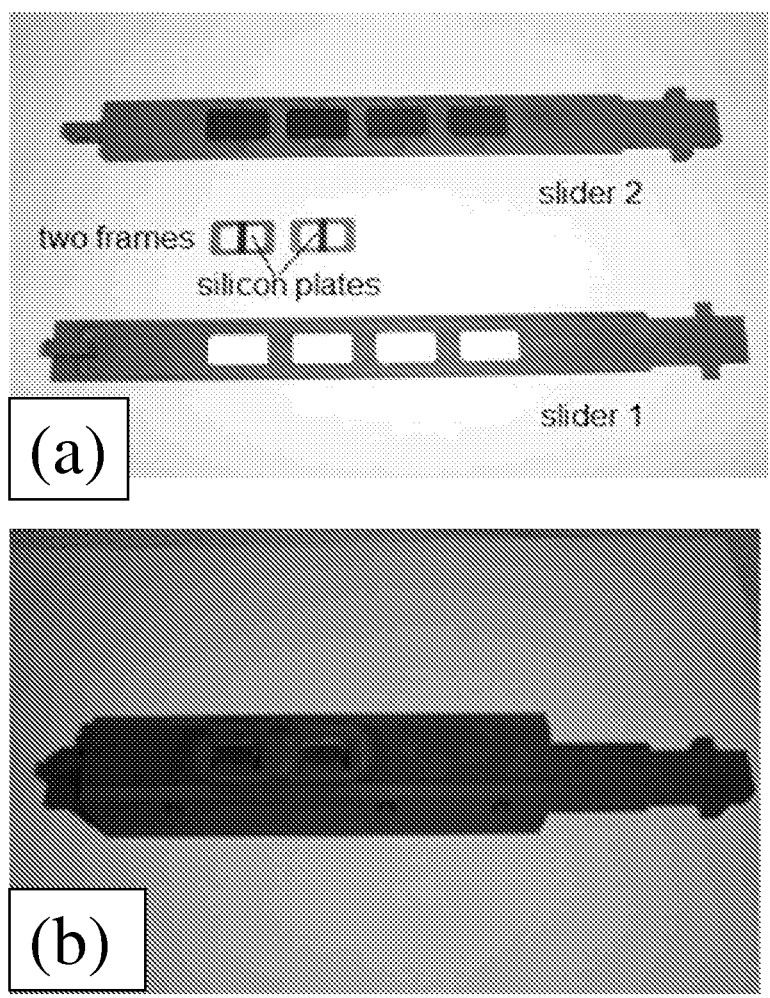
FIG. 2 shows an illustrative refractory device according to an embodiment.

In some aspects, a refractory device suitable for growing semiconductor wafers is described. FIG. 2 shows an illustrative refractory device according to an embodiment. In some embodiments, the device may include a slideboat (see FIG. 2(b), a first slider (slider 1) and a second slider (slider 2). The slideboat may be configured to hold a saturated solution of a semiconductor in at least one molten metal. The first slider may be configured to hold at least one plate (silicon plates shown in FIG. 2(a)). The second slider may be configured to hold at least one substrate and at least one wafer. The first slider and the second slider are placed such that the at least one substrate and the at least one plate are separated by a distance and the at least one plate substantially overlaps the at least one substrate. The at least one plate serves to limit an epitaxial growth of the at least one wafer in a vertical direction and promotes an epitaxial growth in a lateral direction.

In some embodiments, the slideboat may be configured to hold the first slider and the second slider (as seen in FIG. 2(b)). In some embodiments, the first slider and the second slider may be configured to be movable independent of each other. In some embodiments, the slideboat may be made of refractive materials such as, for example, graphite, alumina, silica, tungsten, zirconia, zirconium (IV) silicate, and/or the like. In some embodiments, the first slider and the second slider may be made of refractive materials such as, for example, graphite, alumina, silica, tungsten, zirconia, zirconium (IV) silicate, and/or the like. Depending on the specific materials of the growth liquid, the plate and the substrate, it may be desirable to choose a specific material for the slideboat and the two sliders which may be different from each other in some embodiments. The choice of materials for the slideboat and the slide bar will be readily apparent to a skilled artisan.

In some aspects, a semiconductor wafer grown by lateral diffusion liquid phase epitaxy is described. In some embodiments, a semiconductor wafer may be prepared by a method including providing a monocrystalline semiconductor substrate having at least a portion covered by a mask layer with at least one opening for creating a seed line; placing a plate substantially overlapping the seed line such that the plate and the substrate are separated by a distance; surrounding the plate and the substrate with a growth liquid; placing the plate and the substrate in a heated furnace; and decreasing the temperature of the furnace. The plate may have a surface condition that prevents semiconductor growth. The growth liquid may include a saturated solution of a semiconductor in at least one molten metal. Decreasing the temperature of the furnace may promote precipitation of the semiconductor and induce epitaxial growth of the semiconductor on the substrate along the seed line. The plate serves to limit the epitaxial growth in a vertical direction. Various embodiments of the substrate, the mask layer, the plate, the seed line, the growth liquid, the slideboat and so forth are described herein.

EXAMPLES

Example 1: Substrate Preparation

Figure 3:
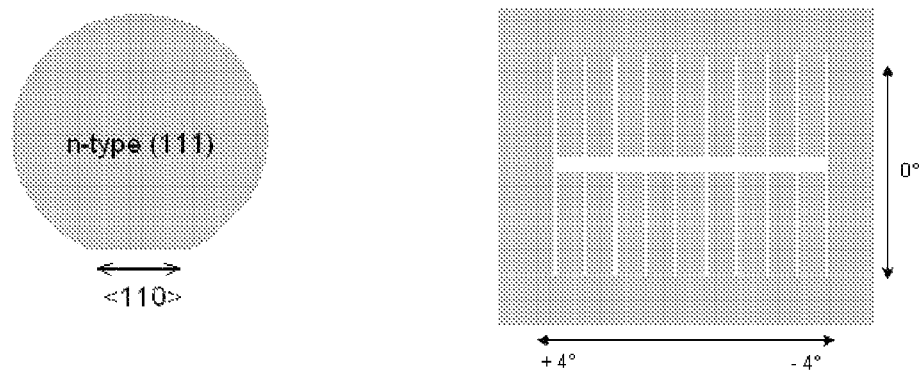
FIG. 3 shows the substrate and seed line orientation.

Substrates were cut from n-type (111) mono-crystalline silicon wafer to a size of 20 mm×12 mm. The surface was mis-orientated by an angle of 4° to the real (111) plane about the primary flat which indicates the <110> direction. The substrates were cleaned by using the following procedure: 10 minutes ultrasonic clean in acetone and methanol to degrease; 10 minutes gentle boil in a solution of $H_2SO_4$:$H_2O_2$=2:1 and rinse in deionized water; 10 minutes gentle boil in a solution of HCl:$H_2O_2$=2:1 and rinse in deionized water; 20 seconds dip in buffered HF solution to remove the native oxide and rinse in deionized water. After cleaning, a $SiO_2$ layer (about 400 nm) was formed by dry oxidation. A set of seed lines was defined on the substrates by photolithography. The seed lines were orientated along the <211> direction, perpendicular to the primary flat (see FIG. 3; in the right image the seed lines are shown in white and the oxide mask in grey). The width of the seed line was 100 μm, and the width of the central bar was 600 μm. Before loading into the LPE furnace, the substrate with the SiO₂ mask was cleaned again by repeating the above cleaning procedures.

Example 2: The Lateral Diffusion Liquid Phase Epitaxy Apparatus

The slideboat used for LPE was mainly composed of three parts: A) a three zone quartz tube furnace with precision temperature control (within 1° C.); B) vacuum and gas system to evacuate the quartz tube and enable the tube to be filled with flowing palladium-purified (8N) hydrogen; and C) a two-bin slideboat made of high density and high purity pyrolytic graphite. The slideboat contained indium (6N pure) in the two bins and had a movable slidebar which could hold the substrate and a source wafer, and move them underneath the bins, keeping them in contact or not in contact with the indium.

Example 3: Silicon Strips Grown by Lateral Diffusion Liquid Phase Epitaxy

After loading the indium, substrate and source wafer into the slideboat, the slideboat was mounted inside the quartz tube. Then the tube was evacuated and filled with flowing palladium-purified (8N) hydrogen before heating. The slideboat was baked overnight at 950° C. to remove the oxide in the indium melt and to prevent the substrate from oxidizing during growth.

Figure 4:
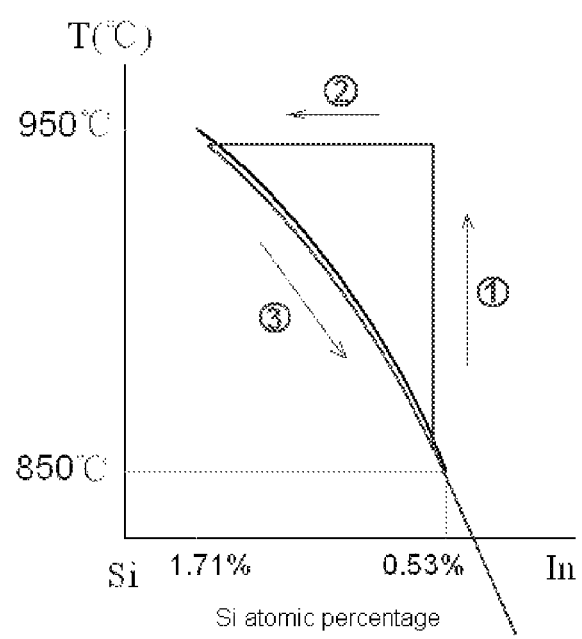
FIG. 4 shows one cycle of LPE silicon growth.

FIG. 4 shows the LPE silicon strip growth cycle between 950° C. and 850° C., namely: 1). The furnace being heated to 950° C.; 2) the indium being in one bin saturated by p-type silicon source wafer at 950° C.; and 3) the substrate being moved to be contacted with the saturated indium/silicon melt and the temperature decreased from 950° C. to 850° C. at the cooling rate of 0.5° C./min. The silicon dissolved in the indium melt was deposited on the substrate until the concentration of silicon in the melt decreases from 1.71% to 0.53% in atomic percentage. The growth was then terminated by moving the substrate away from the silicon-rich indium melt and through the fresh indium in another bin (with no dissolved silicon).

After one growth cycle, the indium melt can be saturated by the source wafer again and multi-cycle growth can be achieved by repeating procedures 1), 2) and 3) sequentially shown in FIG. 4.

Figure 5:
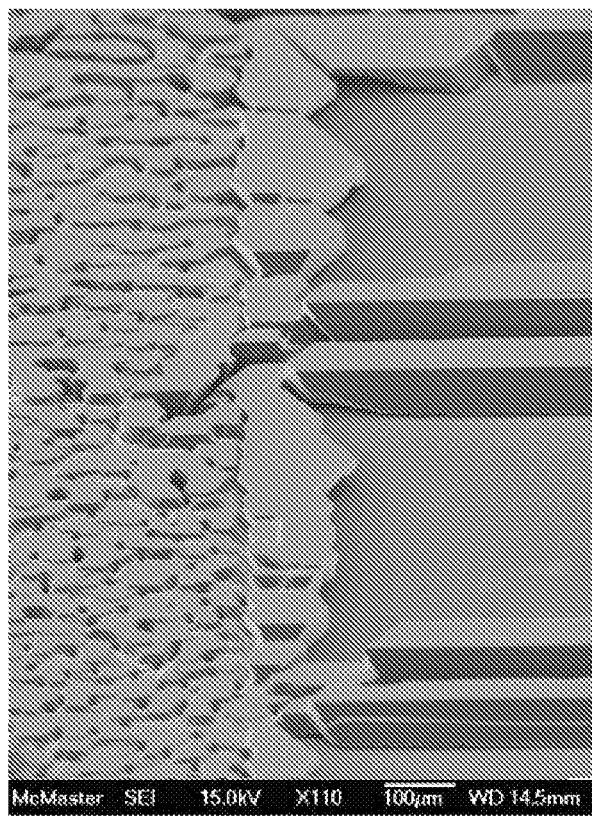
FIG. 5 shows a 45° view of the mono-crystalline silicon strips at intersections of seed lines and the central bar.
Figure 6:
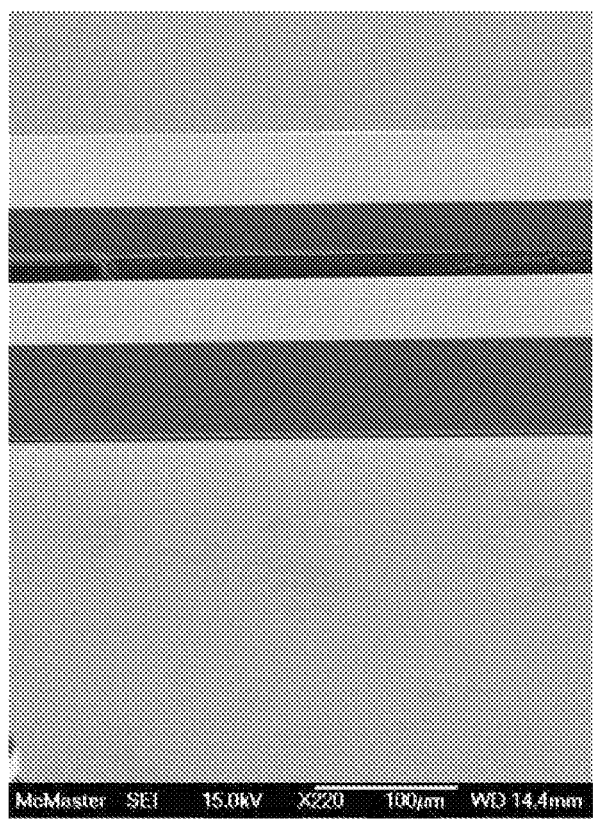
FIG. 6 shows a 45° view of two silicon strips grown along one seed line.

FIG. 5 and FIG. 6 show SEM images of silicon LPE growth on the substrate with oxide mask described above. The growth temperature range was from 950° C. to 850° C., and the cooling rate was 0.5° C./min FIG. 4 shows the silicon epitaxial growth at the intersection of the seed lines and the central bar. The morphology shows large contrast on the large open area (central bar, 600 μm width) and the narrow seed lines (100 μm width). On the central bar area, the surface of the epitaxial layer was composed of terrace and trench structures, indicating poor nucleation and non-uniform growth. However, in both FIG. 5 and FIG. 6, two mono-crystalline silicon strips are grown on each seed line. All facets of the strips were smooth planes and no terraces and trenches were observed.

Figure 7:
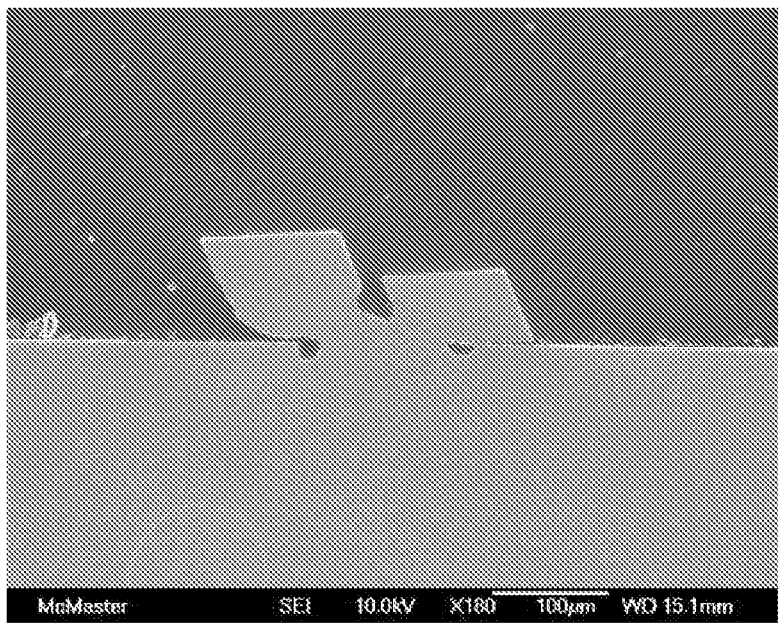
FIG. 7 shows the cross section view of LPE silicon strips on one seed line.
Figure 8:
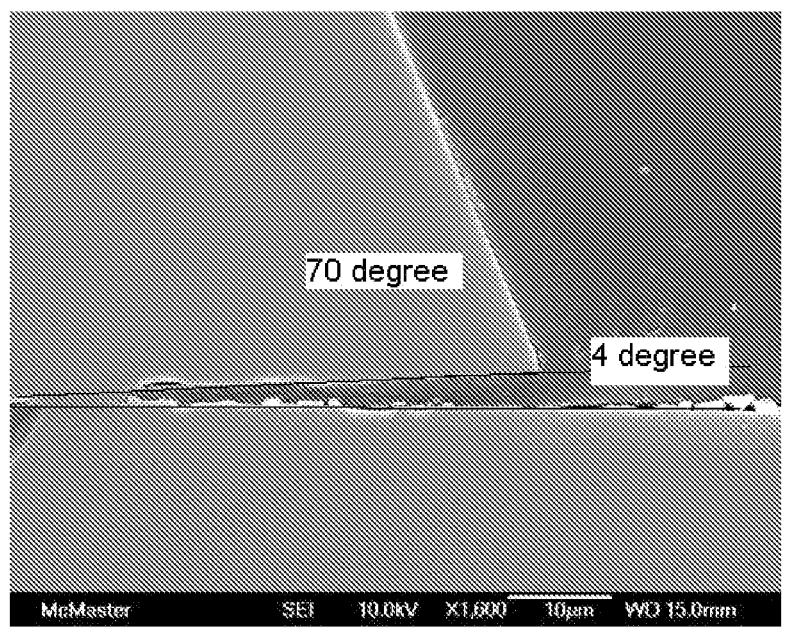
FIG. 8 shows a 4° angle between the bottom plane of the LPE silicon strip and the substrate surface and a 70° angle between facets of the silicon strip.

FIG. 7 shows the cross-section of two silicon strips on the same seed line after one growth cycle, which are shown in FIG. 4 and the middle of FIG. 5. The cross-section of the silicon strip was parallelogram-like. The strips were connected with the substrate on one of their lower corners. The left strip was thicker than the right one and there was a 20 μm gap between them. FIG. 8 shows an enlarged view of the right corner of the strip. The bottom facet had a 4° angle with the substrate surface, which was the same as the misorientation of the substrate, indicating that the bottom facet of the strip was the true (111) plane. The side facet of the strip has approximately a 70° angle with the bottom facet. In silicon the angle between (111) planes is 70° 32° which is very close to the observed angle and therefore, it may be concluded that the side facet was another (111) plane. The average dimensions of silicon strip cross-section were 109.2 μm (Width)×44.1 μm (thickness).

Figure 9:
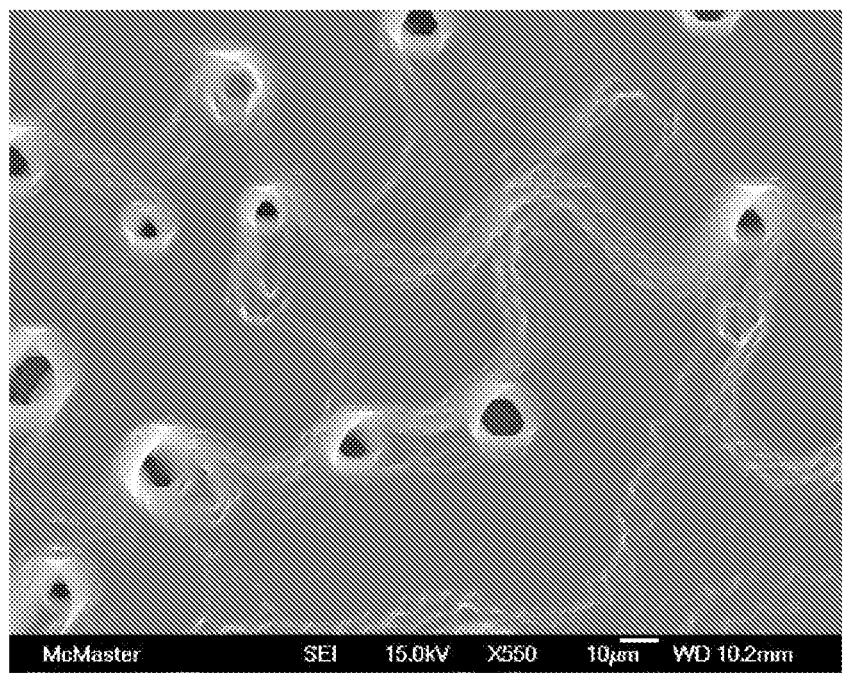
FIG. 9 shows voids and holes in central bar area caused by poor nucleation at 910° C.
Figure 10:
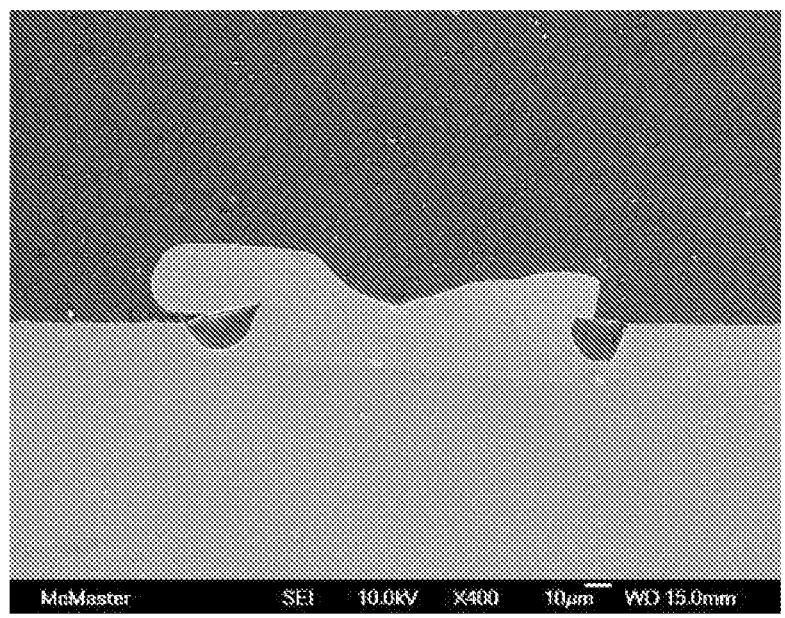
FIG. 10 shows a cross-section of silicon strips whose growth was terminated at 910° C.

Example 4: Short Cycle Lateral Diffusion Liquid Phase Epitaxial Growth of Silicon To study the early stage of the LPE silicon strip growth, a short cycle growth was performed. This growth was started at 950° C. and terminated at 910° C. while keeping the cooling rate at 0.5° C./min. In FIG. 9, the SEM shows the surface of the epitaxial layer in the central bar area with various voids and holes structures, comparing the surface of epitaxial layer with terraces and trench structures shown in FIG. 5. This comparison indicates that higher growth temperature results in higher surface coverage and better nucleation. In FIG. 10, the SEM picture shows the cross-section of the silicon strips whose growth was terminated at 910° C. The (111) facets of the strip are not completely formed and the average cross-section dimensions were 69.8 μm (Width)×25.1 μm (thickness).

Example 5: Monte-Carlo Simulations of the Lateral Diffusion Liquid Phase Epitaxial Growth Process Because of lack of technology to monitor the LPE growth in real time, it is difficult to describe how the silicon strips grow on seed lines. To better understand the mechanism of growth the silicon strips, a growth process was assumed (shown in FIG. 11) and the 2-D Monte Carlo random walk model was used to examine it.

For the purpose of this model, silicon atoms were assumed to be randomly distributed in the indium melt, forming a dilute solution. The movement of one silicon atom was assumed to be random and independent of other silicon atoms. A silicon atom reaching solid silicon was assumed to settle there, while a silicon atom reaching the SiO₂ mask was assumed to continue its random walk. The trend of the mass transport was assumed toward the seed line. Because of this, the growth rate at the Si/SiO₂ interface was higher than that at the center of the seed line. The silicon starts to grow laterally over the SiO₂ mask, and the gap at the center of the seed line starts to form, shown in FIG. 11(2). When the growth is terminated, the cross-section of the silicon strip is shown in FIG. 11(3).

To simplify the simulation, a Monte Carlo random walk model was constructed in a 1000×1000 matrix as follows. Each grid is occupied by either an indium or a silicon atom. The silicon atom can move within the grid in any one of the four directions randomly, with equal probability. When the silicon atom reaches the solid silicon, it sticks there; when silicon atom reaches the SiO₂ mask, it does not stick to or penetrate the SiO₂ mask; when the silicon atom reaches the boundary of the matrix, it disappears. After one silicon atom sticks or disappears, the morphology of the strip is updated and another atom starts its random walk. This procedure was repeated thousands of times and the simulation results were plotted in FIG. 12 and FIG. 13.

Figure 12:
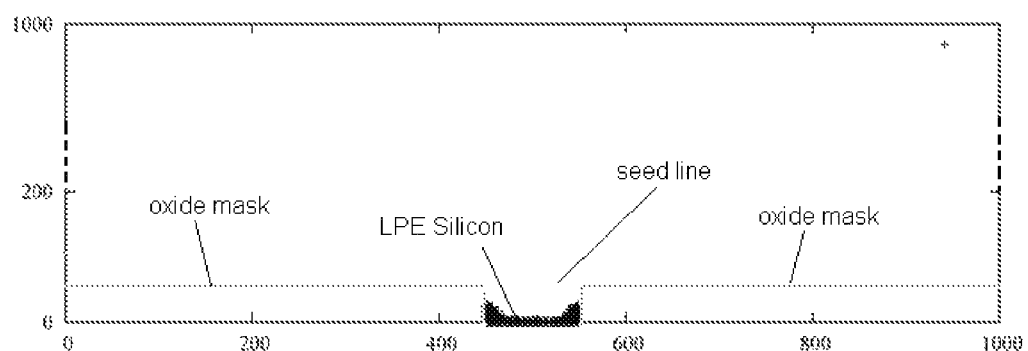
FIG. 12 shows 1000 silicon atom growth in a 100×50 etched back trench.

In FIG. 12, the seed line is located at the center of the x-axis, from unit 450 to 550. At the seed line area, the depth of the trench is 50 units, representing a deep etch. Faster growth rates were observed at edges of the trench near the Si/SiO$_2$ interface corresponding to the assumption that the trend of mass transport on the SiO$_2$ surface is toward the seed line and the trend of mass transport results in higher growth rates at the Si/SiO$_2$ interface than other areas.

Figure 13:
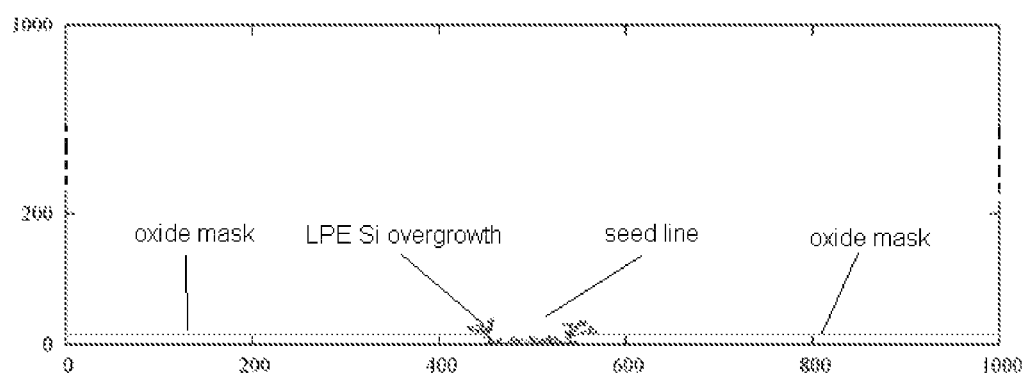
FIG. 13 shows silicon atoms growth in a 100×10 etched back trench and overgrowth on the mask.

In FIG. 13, the depth of the trench was changed to 10 units, representing a shallow etch. The simulation result showed that when the height of epitaxial silicon was higher than the substrate surface the epitaxial lateral overgrowth started consistent with experiment results according to the growth process described in FIG. 11.

Example 6: Selection of Plate

In order to achieve lateral growth while limiting the thickness of the silicon strips, a modified growth process was used. A plate held a set distance above the substrate during growth was introduced. The purpose of this plate was to limit the supply of silicon above the silicon strips so as to limit the growth in thickness of the strips, while allowing a supply of silicon to sustain the lateral growth of the strips.

For the purpose of this example, an oxidized silicon wafer was used as the plate. The oxidation prevented undesired epitaxial growth of silicon on the plate. The plate was held by means of a second slide bar that could be moved independently of the slide bar containing the source wafer and substrate. In this manner, the plate could be moved in or out of the melt as desire.

The plate was surrounded by indium melt such that the indium melt existed between the plate and the substrate. The plate was placed over the growth area at a distance (typically about 0.25 mm to about 1 mm) between the plate and the substrate on which growth was to take place. The plate was chosen so that the semiconductor may not grow on the plate. Semiconductor atoms in the growth solution diffuse to the seed line laterally, rather than from the top of the seed line because the path for the Si atoms from the top is blocked.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

All ranges disclosed herein are inclusive and combinable. As used herein, the term "about" means plus or minus 10% of the numerical value of the number with which it is being used. Therefore, about 50% means in the range of 40% to 60%.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A method for growing semiconductor wafers, the method comprising:
    providing a monocrystalline semiconductor substrate having a crystal structure, wherein at least a portion of the substrate is covered by a mask layer having at least one opening for creating a seed line on the substrate;
    placing a plate having a surface condition that prevents semiconductor growth substantially overlapping the seed line, wherein the plate and the substrate are separated by a distance;
    surrounding the plate and the substrate with a growth liquid comprising a saturated solution of a semiconductor in at least one molten metal;
    placing the plate and the substrate in a furnace heated to a temperature; and
    decreasing the temperature of the furnace to promote precipitation of the semiconductor out of the saturated solution and induce an epitaxial growth of the semiconductor on the substrate along the seed line, wherein the plate serves to limit the epitaxial growth in a vertical direction, and wherein heights of the epitaxial growth of the semiconductor on two sides of the at least one opening are greater than a height of the epitaxial growth of the semiconductor in a middle portion of the at least one opening.

2. The method of claim 1, further comprising cleaning the substrate prior to covering by the mask layer.

3. The method of claim 1, further comprising patterning the seed line on the mask layer using photolithography and etching away a portion of the mask layer to obtain the seed line on the substrate.

4. The method of claim 1, further comprising pre-wetting the substrate and the plate with the growth liquid prior to surrounding the plate and the substrate with the growth liquid.

5. The method of claim 1, further comprising placing the substrate in a slideboat and placing the plate on a slide bar, wherein the slideboat and the slide bar comprise graphite.

6. The method of claim 1, wherein the plate and the substrate are separated by a distance of about 0.25 mm to about 1 mm.

7. The method of claim 1, wherein the furnace is evacuated prior to placing the substrate and the plate in the furnace.

8. The method of claim 1, further comprising filling the furnace with hydrogen gas prior to placing the substrate and the plate.

9. The method of claim 1, further comprising terminating the epitaxial growth by moving the monocrystalline semiconductor substrate away from the growth liquid.

10. The method of claim 1, wherein the epitaxial growth results in a monocrystalline platelet having substantially the same crystal structure as the substrate.

11. The method of claim 1, wherein the substrate is an undoped or doped silicon wafer.

12. The method of claim 11, wherein the mask layer comprises silicon dioxide.

13. The method of claim 11, further comprising disposing the mask layer based on dry oxidation of the silicon wafer.

14. The method of claim 11, wherein the plate comprises silicon dioxide.

15. The method of claim 11, wherein the growth liquid comprises a saturated solution of silicon in molten indium.

16. The method of claim 11, wherein the furnace is heated to a temperature of about 950° C. prior to placing the substrate and the plate in the furnace.

17. The method of claim 16, wherein the temperature of the furnace is decreased to about 850° C. after placing the substrate and the plate in the furnace.

18. The method of claim 17, wherein the temperature of the furnace is decreased at a rate of about 0.25° C./minute.

19. The method of claim 1, wherein the semiconductor is Si, GaAs, Ge, SiC, or combinations thereof.

20. The method of claim 1, wherein the molten metal is In, Sn, Al, Ga, Au, Pb, Cu, or combinations thereof.

21. The method of claim 1, wherein the epitaxial growth of the semiconductor on the substrate along the seed line further comprises two stripes grown on the two sides of the at least one opening, respectively.

* * * * *

UNITED STATES PATENT AND TRADEMARK OFFICE
CERTIFICATE OF CORRECTION

PATENT NO. : 9,824,892 B2  Page 1 of 1
APPLICATION NO. : 13/812089
DATED : November 21, 2017
INVENTOR(S) : Kitai et al.

It is certified that error appears in the above-identified patent and that said Letters Patent is hereby corrected as shown below:

In the Specification

In Column 1, Line 10, delete "2012 and" and insert -- 2012, and --, therefor.

In Column 7, Line 49, delete "C./min FIG. 4" and insert -- C./min. FIG. 4 --, therefor.

In Column 8, Line 5, delete "32°" and insert -- 32′ --, therefor.

Signed and Sealed this
Twenty-sixth Day of June, 2018

Andrei Iancu
*Director of the United States Patent and Trademark Office*